United States Patent [19]

Khanna

[11] 4,031,272
[45] June 21, 1977

[54] HYBRID INTEGRATED CIRCUIT INCLUDING THICK FILM RESISTORS AND THIN FILM CONDUCTORS AND TECHNIQUE FOR FABRICATION THEREOF

[75] Inventor: Satya Pal Khanna, Indianapolis, Ind.

[73] Assignee: Bell Telephone Laboratories, Incorporated, Murray Hill, N.J.

[22] Filed: May 9, 1975

[21] Appl. No.: 576,100

[52] U.S. Cl. .................. 427/96; 427/101; 427/102; 427/103; 427/99; 29/620; 338/308
[51] Int. Cl.² .................. H01C 7/00; B05D 5/12
[58] Field of Search .................. 427/102, 103, 96; 29/620, 624; 338/308; 421/101, 99

[56] References Cited

UNITED STATES PATENTS

| | | | |
|---|---|---|---|
| 3,142,811 | 7/1964 | O'Connell | 427/103 |
| 3,220,881 | 11/1965 | Yando | 427/103 |
| 3,477,055 | 11/1969 | Herbst | 427/103 |
| 3,547,604 | 12/1970 | Davis et al. | 427/102 |
| 3,560,256 | 2/1971 | Abrams | 427/99 |
| 3,669,733 | 6/1972 | Allington | 29/620 |
| 3,781,749 | 12/1973 | Sles | 427/102 |
| 3,787,965 | 1/1974 | Cocca | 427/102 |

OTHER PUBLICATIONS

B231,416, Mar. 1976, Marcantonio, 427/99.

*Primary Examiner*—Michael F. Esposito
*Attorney, Agent, or Firm*—Edward M. Fink

[57] ABSTRACT

A technique for the fabrication of hybrid integrated circuitry combining the expedients of thick and thin film technology is described. A novel processing sequence for attaining ohmic contact between thick film resistors and thin film conductive metallization involves the use of an interphase gold tab as a conductive link.

3 Claims, 4 Drawing Figures

HYBRID INTEGRATED CIRCUIT INCLUDING THICK FILM RESISTORS AND THIN FILM CONDUCTORS AND TECHNIQUE FOR FABRICATION THEREOF

This invention relates to a technique for the fabrication of hybrid integrated circuitry. More particularly, the present invention relates to a technique for the fabrication of hybrid integrated circuitry wherein high resistivity thick film resistors are combined with the fine line definition and thermocompression bondability of thin film conductors.

During the past decade, workers in the electronics industry have focused their interest upon a packaging concept commonly referred to as "hybrid circuitry". This technology has typically involved the fabrication of passive film components, such as resistors, capacitors, and interconnections, in two dimensional arrays upon insulating substrate members. For convenience, the technology has arbitrarily been categorized as either "thin film" or "thick film", such categorization being premised solely upon the nature of the fabrication processes and not upon deposited film thickness.

Studies have revealed that the thin film conductor system offers several advantages over thick film conductors, fine line definition and good thermocompression bonding characteristics being foremost among the advantages. The ability to generate finer conductor lines in thin films leads to higher packing densities, both on the film circuit and upon the silicon integrated circuit (with which it is combined) where narrower beam spacing can be employed. although thin film resistors offer excellent electrical characteristics, they are limited in their range of values, so suggesting the use of thick film resistors which are available in a wide range of resistivities, so enabling the designer to fabricate individual resistors in the megohm range.

Heretofore, functional integration of thin film conductors and thick film resistors on one substrate has been implemented. However, the two types of components were of the so called "stand-alone" type and were interconnected by flying leads. The present invention describes a novel approach for combining these two segments of the technology.

Early efforts to attain integration of thick film resistors and thin film conductors involved screen printing of thick film resistors and the subsequent firing of the deposited material to effect fusion thereof. Thereafter, thin film conductive metallization was vacuum deposited and photolithographic techniques used to pattern generate the desired conductors. Unfortunately, studies revealed that such processes resulted in inordinately high contact resistance characteristics at resistor terminations. This nonohmic behavior was attributed to the composition of the paste and the glass matrix (including conductive components) employed in the thick film resistor fabrication process. Further analysis revealed that after printing and drying of the wet resistor pastes at temperatures ranging from 100°–150° C, the low boiling point solvents had been removed and during subsequent firing, organic binders were removed by oxidation and pyrolysis, so resulting in fusion of the film to the substrate and the formation of a composite cermet film. The resultant formed resistor evidenced a glassy top layer upon which the thin film conductive metallization was subsequently deposited, ohmic contact between resistors and conductors not being attained.

In conventional thick film processing, the conductor paste is initially printed and fired and the resistor paste screened thereon, ohmic contact being achieved by the interdiffusion of overlapping portions of resistor and conductor composition pastes during the firing cycle at temperatures of the order of 900° C. Unfortunately, this interdiffusion cannot occur at the temperatures, 100°–200° C, normally encountered in the vacuum deposition processes employed with the thin film technology. Accordingly, interest centered upon the development of a technique for attaining ohmic contact utilizing thick and thin film technologies.

In accordance with the present invention, this end is attained by means of a novel processing sequence utilizing an interphase gold tab as the conductive link between thin film conductors and the metallic components of the resistor. Briefly, the inventive technique involves printing a gold tab from a thick film gold conductive paste and subsequently subjecting it to firing. Thereafter, the thick film resistor is printed and fired and the thin film conductive metallization deposited by vacuum deposition techniques. Finally, the desired conductors are generated photolithographically. The described process thus combines both thick and thin film technologies and permits the attainment of the desirable characteristics of each technology, the fired thick film gold tab providing ohmic contact between the thin film conductors and the thick film resistors. Circuitry prepared in this manner may be referred to as complex hybrid integrated circuitry which is suitable for use in systems requiring large value resistors and conductors with fine line definition and thermocompression bondability.

The invention will be more fully understood by reference to the following detailed description taken in conjunction with the accompanying drawing wherein.

Figure 1A:
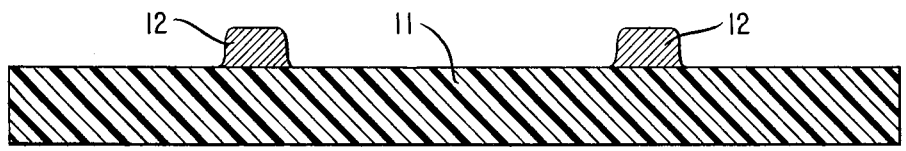
FIG. 1(a) is a front elevational view in cross section of a substrate member having deposited thereon gold termination pads in accordance with the invention.

With reference now more particularly to the drawing:

FIG. 1(a) shows a substrate 11 upon which a hybrid thick and thin film integrated circuit is to be produced in accordance with the present invention. Initially, the substrate is cleansed by conventional cleaning techniques, as for example, by vapor degreasing. Following the cleaning procedure, the substrate is preheated to a temperature ranging from 35°–40° C and gold resistor termination pads 12 are deposited thereon by screen printing thick film conductor paste upon the substrate and, subsequently, drying and firing the paste to form the desired pads in accordance with known techniques. The thickness of the deposited terminations is not critical but should be of sufficient magnitude to uniformly cover the termination areas.

Figure 1B:
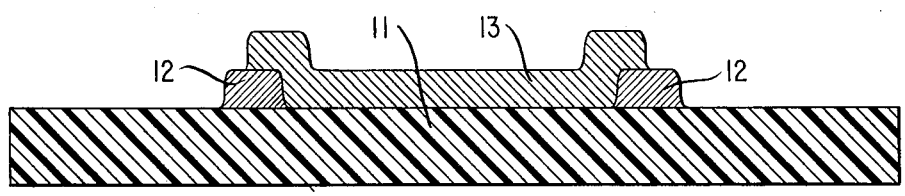
FIG. 1(b) is a front elevational view in cross section of the structure of FIG. 1(a) after deposition thereon of a thick film resistor.

The next step in the inventive process involves screen printing a thick film resistor 13 (FIG. 1(b)) upon the substrate member in a desired pattern and drying and firing in accordance with known thick film deposition techniques.

Figure 1C:
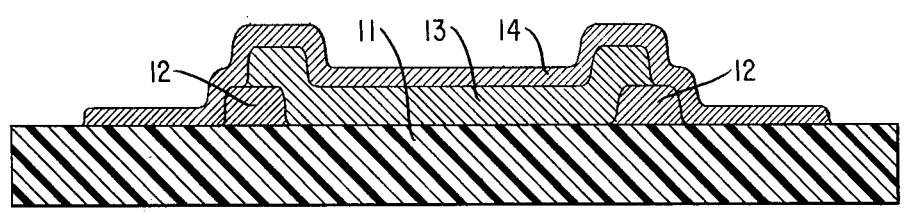
FIG. 1(c) is a front elevational view in cross section of the structure of FIG. 1(b) after deposition thereon of thin film conductive metallization.

Thereafter, the thin film conductive metallization 14 (FIG. 1(c)) is deposited by vacuum evaporation techniques by conventional methods described by L. Holland in "Vacuum Deposition of Thin Films," J. Wiley and Sons, 1956. The thin film conductors typically are comprised of titanium, a noble metal and gold, the titanium being employed as an adhesion promoter in amounts ranging from 500 to 800 Angstroms in thickness. The noble metal is conveniently palladium and is employed in amounts ranging from 2000-4000 Angstroms, the layer of gold being employed in amounts ranging from 10,000-20,000 Angstroms.

Figure 1D:
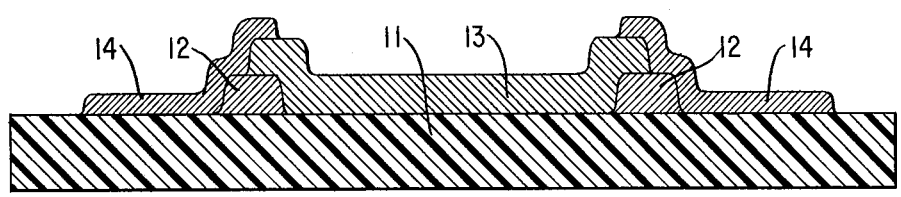
FIG. 1(d) is a front elevational view in cross section of the assembly of FIG. 1(c) after the pattern generation of the conductive metallization.

Following deposition of the thin film conductive metallization, the conductors are pattern generated by any conventional photolithographic technique, so resulting in the structure shown in FIG. 1(d). Final generation of a desired hybrid integrated circuit includes trimming of the resistor to value, scribing circuits, thermocompression bonding of lead frames, thermocompression bonding of silicon integrated circuits and encapsulation. Circuitry prepared in accordance with the foregoing procedure has been found useful in hybrid preamplifier circuits for electret microphone applications.

The foregoing thick and thin film process was used to fabricate a preamplifier circuit suitable for electret microphone use. In order to stay within the confines of the physical package of the electret microphone the resistors in the hybrid circuit were designed with a line width of 0.625 mm. A commercial paste with a nominal sheet resistivity of 10 megohms/square and a second paste with a sheet resistance of 1.0 kilohms/square were used for the resistors. Circuit size was approximately 0.333 inch × 0.325 inch with 99 circuits per 3¾ inch × 4½ inch on an alumina (99.5 percent) substrate.

The following process sequence was used in the fabrication of the circuits:

a. the substrates were preheated to a temperature of 40° C;
b. gold paste, obtained from commercial sources was screen printed through a 325 mesh stainless steel screen with a 0.7 mil emulsion pattern for the gold tabs;
c. the tabs were dried for 15 minutes at room temperature and 15 minutes at 150° C and then fired at 950° C;
d. a first resistor, $R_1$, was screen printed through a 200 mesh stainless steel screen with the desired pattern and a 0.7 mil thick emulsion;
e. the resistor was dried for 15 minutes at room temperature and 15 minutes at 150° C;
f. steps (d) and (e) were repeated for a second resistor $R_2$;
g. firing the two resistors;
h. the substrates were cleaned and titanium, palladium and gold were successively evaporated thereon in thicknesses of 600, 3000 and 15,000 Angstroms, respectively, in an electron beam gun evaporator, and
i. the conductors were pattern generated.

The circuit of interest was completed in the manner noted above.

Noise level measurements were performed on 100 samples of $R_2$ resistors from four different lots, the average level of the noise index being −8.59 db with a probable error of ± 0.76 db. This compares favorably with the noise figure of approximately −4.0 db claimed by the manufacturer of the resistor composition for a resistor of comparable size generated with standard thick film technology.

The external leads were thermocompression bonded to the thin film bonding pads on the circuits using gold plated copper leads. Two hundred of the leads from five different lots of substrates were then pulled to destruction at 90° to determine the bond strength of the leads. A similar control group of ceramic substrates evaporated and pattern generated with the circuits was also bonded and pull tested, the control not having been processed by thick film processing. No significant differences were noted between the circuits and the control group, the average pull strength being 3.3 kg with all leads having a pull strength greater than 1.4 kg.

TCR values for the two resistors were calculated using ten samples and measuring the resistor values at room temperature in liquid nitrogen, the values being −210 ppm/° C for $R_1$ and −220 ppm/° C for $R_2$. The resistor line widths for the resistors across one substrate screened were within ± 15.0 micrometer of the design value of 625 micrometer.

Thermal aging, power aging and humidity aging tests were then performed on various circuits to verify that processing had not degraded the reliability of the resistors. Thermal aging was effected at 150° C for a time period of 500 hours. The average percent resistance change for $R_1$ was +1.6 percent and −0.14 percent for $R_2$, the major portion of the resistance change occurring during the first 20 hours of aging.

$R_2$ resistors were power aged at 30, 100 and 1000 watts/square inch for 50 hours. No appreciable changes in $R_2$ resistances were detected. Finally, the circuits were aged in a 90 percent relative humidity ambient at 65° C for 100 hours without encapsulation or power, no significant changes in the electrical or physical characteristics of the resistors being observed.

What is claimed is:

1. Technique for fabricating a hybrid integrated circuit including the steps of successively depositing a thick film resistor and thin film conductive metallization upon a substrate characterized in that gold tabs are deposited upon the substrate by screen printing of a gold paste and subsequent firing prior to deposition of the thick film resistor, the gold tabs serving as resistor termination pads.

2. Technique in accordance with claim 1 wherein the conductive metallization comprises titanium, palladium and gold.

3. Technique in accordance with claim 1 wherein the thick film resistor is deposited by screen printing of a resistive composition and subsequent firing at 950° C.

* * * * *